US00RE36773E

United States Patent [19]

Nomi et al.

[11] E Patent Number: Re. 36,773

[45] Reissued Date of Patent: Jul. 11, 2000

[54] METHOD FOR PLATING USING NESTED PLATING BUSES AND SEMICONDUCTOR DEVICE HAVING THE SAME

[75] Inventors: Victor K. Nomi, Austin; John R. Pastore, Leander; Twila J. Reeves, Round Rock, all of Tex.

[73] Assignee: Motorola, Inc., Schaumburg, Ill.

[21] Appl. No.: 08/970,272

[22] Filed: Nov. 14, 1997

Related U.S. Patent Documents

Reissue of:

[64] Patent No.: 5,467,252
Issued: Nov. 14, 1995
Appl. No.: 08/136,845
Filed: Oct. 18, 1993

[51] Int. Cl.[7] ..... H05K 7/02

[52] U.S. Cl. ..... 361/760; 361/748; 361/761; 361/772; 361/775; 361/776; 361/777; 257/692; 257/784; 257/697; 257/690; 257/787; 257/778; 257/741; 174/261; 174/70 B; 29/840

[58] Field of Search ..... 361/760, 748, 361/761, 772, 775, 776, 777; 257/692, 784, 697, 690, 787, 778, 741; 174/261, 70 B; 29/840

[56] References Cited

U.S. PATENT DOCUMENTS

| | | | |
|---|---|---|---|
| 3,829,741 | 8/1974 | Athy | 361/756 |
| 3,932,016 | 1/1976 | Ammenheuser | 439/377 |
| 4,989,317 | 2/1991 | Firl et al. | 29/840 |
| 5,052,936 | 10/1991 | Biechler et al. | 439/60 |
| 5,126,813 | 6/1992 | Takahashi et al. | 357/26 |
| 5,189,598 | 2/1993 | Bolan et al. | 361/748 |
| 5,218,172 | 6/1993 | Seidel | 174/268 |
| 5,285,352 | 2/1994 | Pastore et al. | 361/707 |
| 5,468,995 | 11/1995 | Higgins, III | 257/697 |
| 5,583,377 | 12/1996 | Higgins, III | 257/707 |
| 5,612,576 | 3/1997 | Wilson et al. | 257/788 |
| 5,710,693 | 1/1998 | Tsukada et al. | 361/686 |
| 5,756,380 | 5/1998 | Berg et al. | 438/126 |

FOREIGN PATENT DOCUMENTS

| | | | |
|---|---|---|---|
| 0222166 | 9/1990 | Japan | 357/70 |
| 4-109642 | 4/1992 | Japan . | |

*Primary Examiner*—Leo P. Picard
*Assistant Examiner*—David Foster

[57] ABSTRACT

Routing density of a wiring substrate (10) is increased by providing a nested plating bus (18) as a supplement to an external plating bus (16). A first group of conductive traces (14) is connected to the nested plating bus, while another group of traces is connected to the external plating bus. After the conductive elements are plated, the nested plating bus is removed by etching, milling, or stamping techniques. Use of a nested plating bus increases I/O count for a given substrate area and/or reduces the need to have routing on more than one layer of the substrate.

21 Claims, 2 Drawing Sheets

METHOD FOR PLATING USING NESTED PLATING BUSES AND SEMICONDUCTOR DEVICE HAVING THE SAME

Matter enclosed in heavy brackets [ ] appears in the original patent but forms no part of this reissue specification; matter printed in italics indicates the additions made by reissue.

FIELD OF THE INVENTION

The present invention relates to plating and plated devices in general, and more specifically to plating using nested plating buses and semiconductor devices having such nested plating buses.

BACKGROUND OF THE INVENTION

Due to the constant push for smaller and smaller products, it has become common for integrated circuits (ICs) once contained on two or more individual semiconductor die or chips to be combined into a single, larger IC device. For example, traditional microprocessor circuits are being combined on a single chip with digital signal process circuits. These combined ICs have the advantage of better reliability due to fewer total external connections, but have higher input/output (I/O) counts than many of the individual ICs. Often, these combined devices have I/Os in the 200+ range. Additionally, new ICs are being designed "from the ground up" with many advanced features which also result in 200+ I/Os. Thus, high I/O counts are becoming more and more commonplace.

Over Molded Pad Array Carrier or OMPAC is one successful method for containing relatively large I/O count into a small footprint at low cost. The OMPAC package (a type of ball grid array or BGA package) consists of a printed circuit board (PCB) or other insulating material substrate having a plurality of conductive traces on both the top and bottom surfaces, vias connecting the top traces to the bottom traces, and solder pads at ends of the bottom traces. The traces, vias, and pads, are typically formed of copper and are subsequently plated with nickel and gold. A semiconductor die is attached to the top of the substrate, and wires are used to electrically couple the die to the top set of traces. An organic encapsulation is applied over the die, wires and portions of the top of the substrate. A mass of solder in the form of spheres, paste, or plating is then applied to the solder pads on the bottom of the package. Since OMPAC packages have an array of solder pads covering most of the package bottom, the package is typically much smaller than corresponding peripherally leaded packages. An array takes advantage of the entire area of the package, whereas peripherally leaded packages can only take advantage of the outer perimeter of the package.

Due to the basic nature of the package components, OMPAC is considered a low cost package. The most expensive individual cost component is the substrate. The cost of a single layer, double sided substrate is significantly lower than that of a multilayer substrate and is therefore preferred for OMPAC applications. One of the limitations of single layer substrates is the restriction in routing electrical connections from the vias to an external plating bus formed at the periphery of the package. Electrical connections to the plating bus are required for electrolytic plating of nickel and gold onto those portions of the copper laminate which will be used for subsequent electrical bonding (i.e. die bonding, wire bonding, and solder ball reflow) or for electrical probing and testing. The nickel and gold plating layers protect the copper from oxidation, resulting in a surface which is easier to bond and probe. In order to accomplish electrolytic plating, all conductive parts which are to be plated are electrically short-circuited so that necessary current applied during the electrolytic process easily passes through all members to be plated. This is typically accomplished by routing all members to an external plating bus. The bus must eventually be removed to create electrical isolation between the various conductive features.

To achieve a higher I/O count without increasing package size and without moving to a multiple layer substrate, the routing density (i.e. number of traces per unit area) on the outer surfaces must be increased. The routing density of a substrate used in OMPAC packages is dictated by the size of the via holes, the size of the annular rings surrounding each via hole, the solder pad diameter, the minimum copper trace width and the minimum gap between copper traces. Depending on the capabilities of the substrate manufacturer and on the I/O count of the package, the external plating connections also often directly limit the number of discrete I/O connections possible for single layer substrate packages. In other words, the need to connect all traces to an external, peripheral plating bus often restricts the routing density for a given size substrate.

In the case of a typical OMPAC substrate, (assuming 1.5 mm solder pad pitch, 0.25 mm via diameter, 0.50 mm annular via ring diameter, 0.89 mm solder pad diameter, 0.1 mm copper trace width and 0.1 mm gap between copper traces), it is possible to have up to 3 traces between vias on the top surface of the package, and to have up to 2 traces between solder pads on the bottom surface. These traces can be used to either route from wire bond fingers to vias (where wire bond fingers are pads at the ends of top surface traces which surround the die and which receive the bonding wires), or from vias to the external plating bus. These figures put a lower limit on the size of a particular substrate for a given number of I/Os. In order to achieve additional routing, and thus a higher I/O count, with the current single layer OMPAC substrates, the via and solder pad pitches would have to be increased to allow more traces to fit between pads and vias, or the via and solder pad diameters would have to be decreased. Increasing the solder pad and via pitches undesirably increases the size of the substrate and size of the final package, whereas decreasing solder pad and via diameters would undesirably increase the cost to manufacture the substrate and reduce the solder joint strength due to the smaller solder pads. Accordingly, it would be desirable to eliminate the need to route traces to external plating buses. This would reduce the number of traces that need to be routed between vias and between solder pads, thereby keeping substrate size to a minimum while increasing routing density.

One known solution to the routing problem imposed by the need to route traces to an external plating bus is the use of so-called "electroless" plating processes. External plating connections would not be required if the substrates were nickel and gold plated using electroless plating techniques since electroless plating does not require all conductive elements to be short-circuited together. However, electroless plating is inherently thinner and more porous than electrolytic plating which makes it marginal at preventing oxidation of the underlying copper. This in turn makes it more difficult to achieve good, reliable bonding onto the plated surfaces. Consequently, the use of electroless gold plating is limited to special cases where the time and temperature exposures are short and low enough that the resulting oxidation does not impede the creation of reliable bonds.

Therefore, an alternative to the existing external peripheral plating bus used in OMPAC semiconductor devices, and similar devices having wired substrates, would be desirable. Moreover, such an alternative should improve the existing plating process by allowing more traces and vias to be formed in a given area of the substrate than presently possible.

SUMMARY OF THE INVENTION

In accordance with one form of the invention, a plating method is used to plate a plurality of radially arranged conductive members. Each conductive member has an inner end and an outer end. The plurality of conductive members is divided into a first group of conductive members and a second group of conductive members. Each outer end of conductive members in the first group is connected to an outer plating bus. Each inner end of the conductive members of the second group is connected to a nested plating bus inside the outer plating bus, while each outer end of the conductive members of the second group is unconnected to the outer plating bus. The conductive members of both the first and second group are then plated. In another form of the present invention, a semiconductor device includes features of a substrate plated by such a method.

DETAILED DESCRIPTION OF A PREFERRED EMBODIMENT

Figure 1:
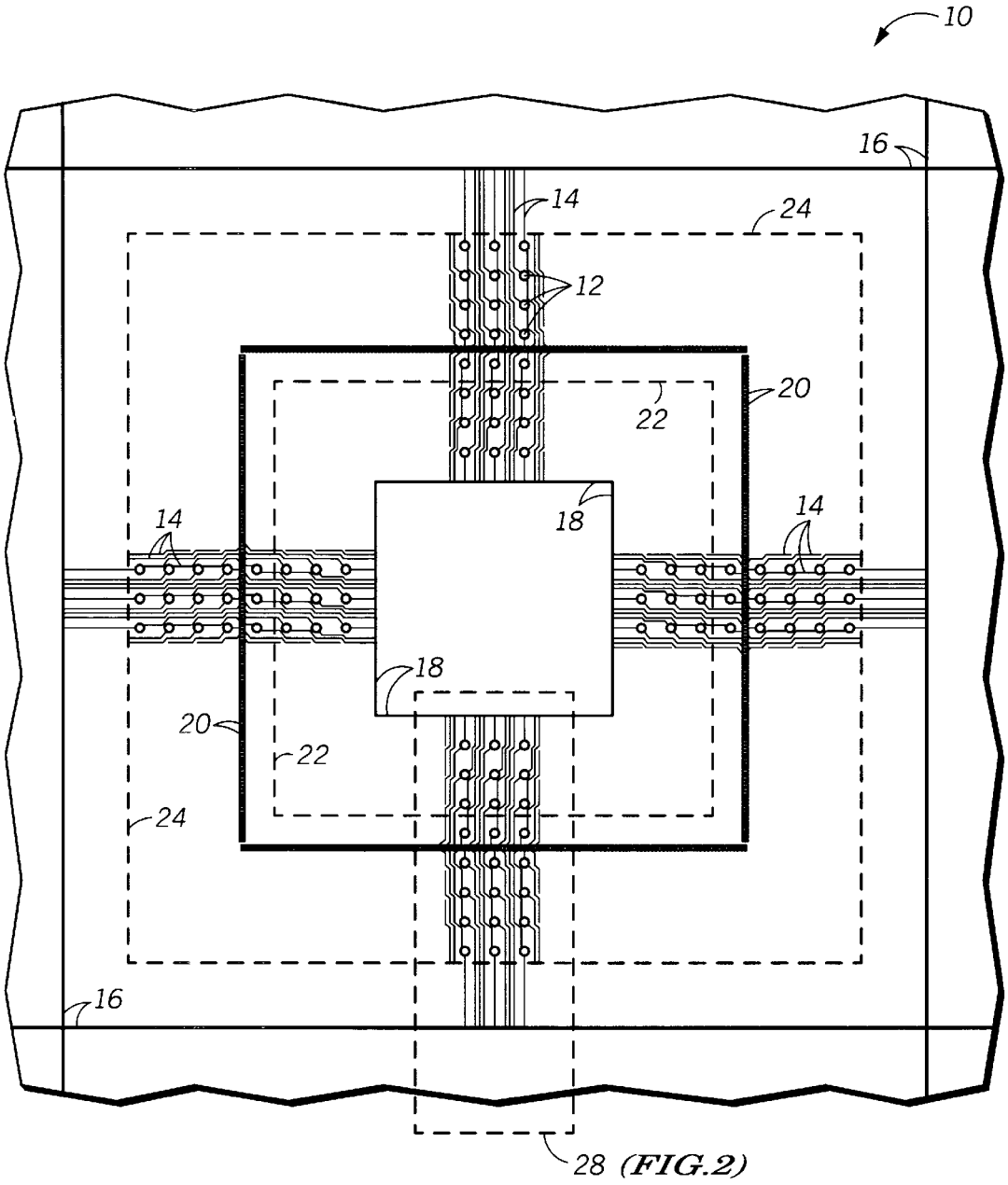
FIG. 1 is a top view of a portion of a substrate used for plating, and for making a semiconductor device, in accordance with the present invention.

The present invention increases the maximum possible I/O count for a given substrate size by allowing a nested plating bus to complement the existing external plating bus. In addition, the use of the nested plating bus reduces or eliminates the need for bottom side electrical routing which should improve package reliability and electrical performance by increasing the distance between discrete conductive traces, vias and solder pads on the bottom side of the substrate.

These and other features, and advantages, of the present invention will be more clearly understood from the following detailed description taken in conjunction with the accompanying drawings. It is important to point out that the illustrations may not necessarily be drawn to scale, and that there may be other embodiments of the present invention which are not specifically illustrated. Also, like reference numerals may be used throughout the various views, indicating identical, corresponding, or similar elements.

FIG. 1 is a top view of a portion of a PCB or other insulating material substrate 10 which is plated by a method in accordance with the present invention. The electrical usefulness of the substrate for an electronic application is created by various conductive elements. These include a plurality of plated through holes or vias 12, a plurality of conductive traces 14, an external plating bus 16, a nested plating bus 18, and a plurality of bonding fingers 20. In a preferred embodiment of the present invention, each of these conductive members is formed of laminated or deposited copper. Conductive traces 14 can be located on any signal routing layer (top or bottom surfaces of single layer double sided substrates, or internal layers of multilayer substrates). Conductive traces 14 are used to route from bonding fingers 20 to vias 12 which are in turn connected to solder pads (not shown) on the bottom of substrate 10. The portions of the traces connecting bonding fingers 20 to vias 12 are electrically functional in a finished semiconductor device in that these portions are used to transmit signals during device operation. For electrolytic plating purposes, the conductive traces 14 are routed to either the nested plating bus 18 which lies within the finished package outline 24, or to the external plating bus 16 which lies outside the finished package outline 24. Finished package outline 24 represents where substrate 10 will be excised to form a completed semiconductor device. The portions of the traces used to route from vias to a plating bus are necessary only for plating purposes, not for functional purposes during semiconductor device operation. As illustrated, nested plating bus 18 also lies within a die receiving area 22, which represents the area of substrate 10 onto which a semiconductor die (not shown in FIG. 1) will eventually be mounted. However, it is important to note that the present invention does not require that the nested plating bus be within the die receiving area. Benefits of the present invention are reaped as long as the nested plating bus lies within the external finished package outline.

Figure 2:
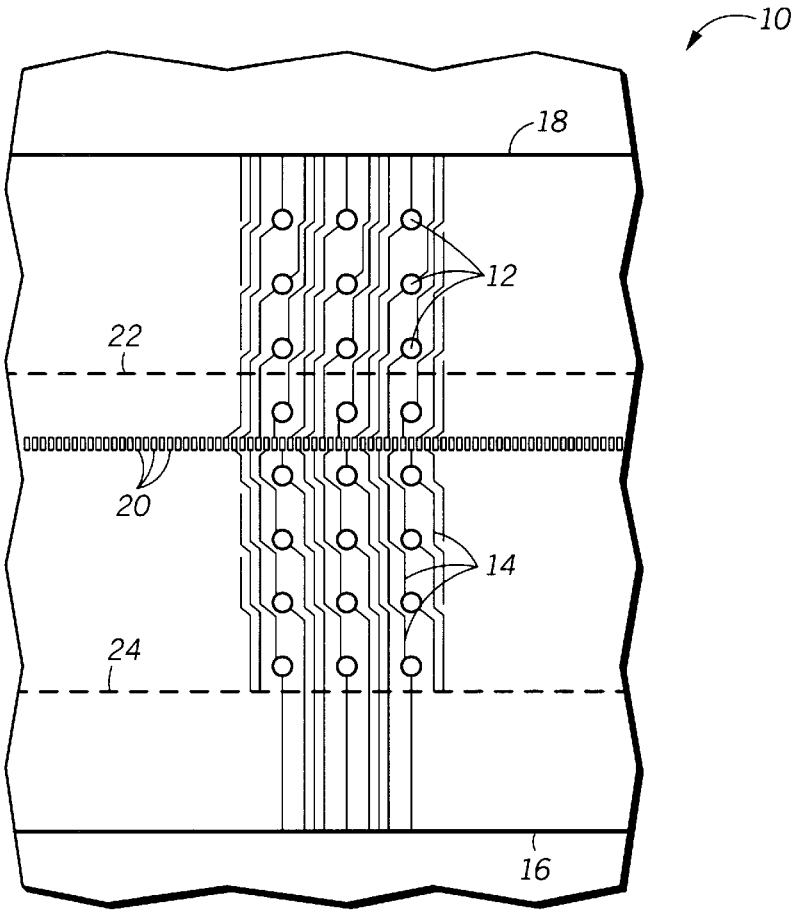
FIG. 2 is an exploded view of a portion of the substrate illustrated in FIG. 1.

FIG. 2 is an exploded view of highlighted region 28 of FIG. 1. As shown, conductive traces 14 are connected to vias 12 both above and below the row of bonding fingers 20, and are then routed to either the nested plating bus 18 or to the external plating 16. Traces connected to vias below the row of bonding fingers are a first group of traces, and are also connected to external plating bus 16. Traces connected to vias above the row of bonding fingers are a second group of traces, and are also connected to nested plating bus 18. In the example shown, it is possible to route conductive traces 14 to eight rows of vias 12, four rows on either side of the row of bonding fingers 20. As illustrated in FIG. 2, all of the routing is on the top side of the substrate which maximizes the electrical isolation on the bottom side of the substrate. In prior art substrates, routing is often needed on both the top and bottom sides of the substrate. However, manufacturers would like to eliminate any unnecessary surface routing for several reasons. One reason is that extraneous routing may create noise during device operation. Another reason is that the more routing there is on the surface, the more likely unwanted short-circuiting will occur between adjacent conductive members.

Current single layer OMPAC substrates only utilize an external plating bus, such as external plating bus 16. With use of only an external plating bus, and assuming the feature dimensions listed in the background, conductive traces can be routed to only a maximum of six rows of vias. Moreover, to achieve this maximum 6 rows of vias, substrate designs require two conductive traces between vias on the bottom side of the substrate, in addition to three conductive traces between vias on the top side of the substrate. The use of both top and bottom side traces in current substrates is undesirable both from a manufacturing/reliability point of view, and from a device operational performance point of view, as discussed above. The present invention permits eight rows of vias without any bottom side traces. Thus, more I/Os can be achieved in a single layer substrate using a plating method in accordance with the present invention, then if using a traditional plating method for a single layer substrate. Moreover, the higher I/O count possible with the present invention can be achieved by routing on only one surface of the substrate, whereas multilayer routing would be necessary to achieve comparable I/O counts on existing substrates and with existing plating techniques. It is important to note, however, that the present invention is not limited to plating substrates having only one-sided routing. Benefits of the present invention can also be obtained in substrates having multiple layers of routing, both external and internal.

Figure 3:
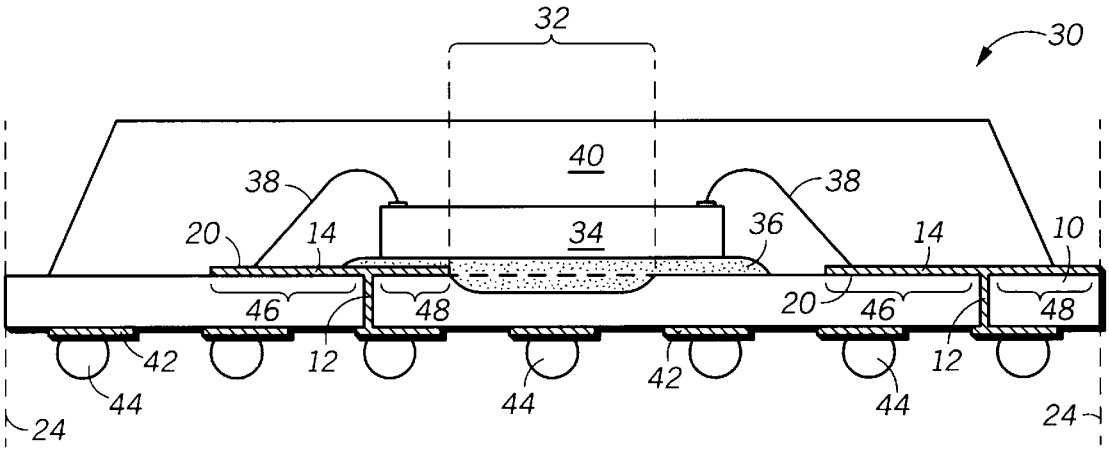
FIG. 3 is a cross-sectional view of a semiconductor device utilizing a substrate such as that illustrated in FIG. 1, also in accordance with the present invention.

FIG. 3 is a cross-sectional view of an OMPAC semiconductor device 30 in accordance with the present invention. Device 30 includes a portion of substrate 10, namely that portion denoted by finished package outline 24 of FIG. 1. Also in device 30 is a semiconductor die 34 attached to the substrate 10 by means of an adhesive die attach 36. Bonding wires 38 are used to connect the semiconductor die 34 to plated conductive traces 14, or more specifically to bonding fingers 20 at the ends of the conductive traces (although in FIG. 3, the bonding fingers and traces are indistinguishable). A resin package body 40 is then molded or dispensed over the semiconductor die 34, the bonding wires 38, and over most portions of the top side of substrate 10 to provide environmental protection. A mass of solder in the form of spheres, paste or plating 44 is then applied to a plurality of solder pads 42 formed on the bottom side of substrate 10. The pads are electrically coupled to the semiconductor die through vias 12, bonding wires 38 and conductive traces 14. Many of the manufacturing operations thus far described can be performed while substrate 10 is in a strip or sheet form having many die or device sites. At some stage in manufacturing, device 30 is removed from the surrounding substrate material and forms the outside dimension (the finished package outline) 24 of the individual semiconductor device 30. In one embodiment of the present invention, device 30 is excised after molding package body 40 and after the application of solder 44 to solder pads 42, being practically the last value-added manufacturing step. In another embodiment, excision occurs after molding but before solder 44 is applied.

As illustrated in FIG. 3, substrate 10 has an etched/milled area 32 which is where a nested plating bus, and perhaps inner portions of conductive traces 14, have been removed from substrate 10 so that the conductive traces are no longer electrically short-circuited together. Area 32, in preferred embodiments, is formed using known etching or milling techniques. Instead, the nested plating bus may be severed by means of punching or other material removal processes. Although a solid area has been removed from substrate 10 as illustrated in FIG. 3, it is also possible to sever the nested plating bus by removing a smaller portion of the substrate, for instance by milling a shape or outline which conforms to the shape of the bus (e.g. a rectangular groove). It is also appropriate to note that the shape of a nested plating bus is not important to practicing the invention.

As illustrated in FIG. 3, trace 14 in the left half of device 30 begins at bonding finger 20 and terminates at the edge of removed area 32. Thus, the right end of this trace was previously connected to a nested plating bus in accordance with the present invention. The trace 14 in the right half of device 30 likewise begins at bonding finger 20, but extends away from area 32 to the finished package outline 24 of substrate 10. Thus, the right end of this trace was previously connected to an external plating bus. As also illustrated in FIG. 3, each trace 14 is divided into two portions, a functional portion 46 and a plating portion 48. The functional portion 46 of each trace is that portion of the trace which electrically couples die 34 to an external I/O connection, such as solder ball 44. The plating portion 48 of each trace is that portion of the trace which routes the trace to a plating bus, either external or nested, but is otherwise not necessary for device operation. Another term for plating portions 48 known in the art in devices having only external plating buses (e.g. like in the right hand portion of device 30) is a plating stub.

The foregoing description and illustrations contained herein demonstrate many of the advantages associated with the present invention. In particular, it has been revealed that use of a nested plating bus increases the maximum possible I/O count for a given substrate. Moreover, the use of a nested plating bus reduces the requirement for bottom side electrical routing which should improve package reliability and electrical performance by increasing the distance between conductive traces and metal features. Another advantage is that depending on the specific substrate configuration, use of a nested plating bus can reduce the length of the plating connections which will reduce electrical parasitics and thus enhance the performance of the semiconductor device.

Thus it is apparent that there has been provided, in accordance with the invention, a method for plating using nested plating buses and a semiconductor device having the same, that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, multilayer substrate designs are not shown but will be subject to the limitations and advantages discussed for single layer substrates. In addition, the invention is not limited to any particular shape for a nested plating bus. Furthermore, a substrate used in accordance with the present invention may utilize filled vias as opposed to plated through holes. Furthermore, while a description of the present invention included the elimination of bottom side routing in accordance with one embodiment, the benefits of the present invention can likewise be achieved in substrates which have both top and bottom side routing, either top or bottom side routing alone, or external surface routing in conjunction with internal surface routing. Moreover, the present invention may be practiced wherein a nested plating bus is on one surface of a substrate while the external plating bus is on the opposing surface. In addition, the present invention is not limited to applications of OMPAC semiconductor devices or ball grid arrays, but instead can be used in any device or process which is to be plated. Therefore, it is intended that this invention encompass all such variations and modifications as fall within the scope of the appended claims.

What is claimed is:

1. A method for plating a plurality of radially arranged conductive members, wherein each conductive member has an inner end and an outer end and wherein the plurality of conductive members is divided into a first group of conductive members and a second group of conductive members, comprising the steps of:

connecting the outer end of each member of the first group to an outer plating bus;

connecting the inner end of each member of the second group to a nested plating bus that is inside the outer plating bus, without connecting the outer end of each member of the second group to the outer plating bus; and plating the plurality of conductive members.

2. The method of claim 1 wherein the plurality of conductive members comprise a plurality of conductive traces on a surface of a printed wiring substrate.

3. The method of claim 2 wherein the printed wiring substrate has a plurality of bonding fingers for wire bonding to a semiconductor die, and wherein the inner end of each member of the first group is connected to a corresponding bonding finger, and the outer end of each member of the second group is connected to a different corresponding bonding finger than the corresponding bonding finger of each member of the first group.

4. The method of claim 3 wherein the plurality of bonding fingers divides the plurality of conductive members into the first and the second groups of conductive members.

5. A method for plating a wiring substrate comprising the steps of:

providing an insulating substrate material having [a surface,] a package receiving area, and a die receiving area within the package receiving area;

forming an outer plating bus on [the surface of] the substrate [which], *wherein the outer plating bus* substantially surrounds the package receiving area;

forming a nested plating bus on [the surface of] the substrate and within the outer plating bus;

forming a first plurality of conductive traces on [the surface of] the substrate and within the package receiving area, the first plurality of traces being connected to the outer plating bus;

forming a second plurality of conductive traces on [the surface of] the substrate and within the package receiving area, the second plurality of traces being connected to the outer plating bus; and plating the first and the second pluralities of conductive traces.

6. The method of claim 5 wherein the first and second pluralities of conductive traces are physically separated from one another by a plurality of conductive bonding fingers formed on the [the surface of] the substrate and substantially surrounding the die receiving area.

7. The method of claim 5 wherein the steps of forming the outer plating bus, the nested plating bus, the first plurality of conductive traces, and the second plurality of conductive traces are accomplished simultaneously.

8. The method of claim 5 wherein the outer plating bus and the nested plating bus are both substantially rectangular rings.

9. The method of claim 5 further comprising the step of removing the nested plating bus from within the package receiving area to form a plurality of plating stubs.

10. The method of claim 9 wherein the step of removing the nested plating bus comprises chemically etching the nested plating bus.

11. The method of claim 9 wherein the step of removing the nested plating bus comprises mechanically removing the nested plating bus.

12. The method of claim 5 wherein the nested plating bus is formed within the die receiving area of the substrate.

13. A method for making a semiconductor device comprising the steps of:

providing a wiring substrate made in accordance with a method comprising the steps of:

providing an insulating substrate material having [a surface,] a package receiving area, and a die receiving area within the package receiving area;

forming an outer plating bus on [the surface of] the substrate which substantially surrounds the package receiving area;

forming a nested plating bus on [the surface of] the substrate and within the outer plating bus;

forming a first plurality of conductive traces on [the surface of] the substrate and within the package receiving area, the first plurality of traces being connected to the outer plating bus;

forming a second plurality of conductive traces on [the surface of] the substrate and within the package receiving area, the second plurality of traces being connected to the nested plating bus without being connected to the outer plating bus;

plating the first and the second pluralities of conductive traces; and removing the nested plating bus from the [surface of the] substrate, leaving a plurality of plating stubs on the [surface] *substrate;* providing a semiconductor die;

positioning the die within the die receiving area;

electrically coupling the die to the first and the second pluralities of conductive traces; and encapsulating the die in a protective body.

14. The method of claim 13 wherein the step of positioning the die comprises positioning the die over the plurality of plating stubs.

15. The method of claim 13 further comprising the step of excising the package receiving area of the substrate from remaining portions of the substrate.

16. A semiconductor device comprising:

a printed wiring substrate having a periphery, a surface, a die receiving area on the surface, a plurality of conductive bonding fingers formed on the surface and surrounding the die receiving area, a first plurality of conductive vias extending through the substrate and positioned within the plurality of conductive bonding fingers, a second plurality of conductive vias extending through the substrate and positioned without the plurality of conductive bonding fingers, wherein each via of the first and the second pluralities of vias has two associated trace portions on the [surface] *substrate,* a bonding trace portion and a plating trace portion, wherein the bonding trace portion of each via of the first and the second pluralities of vias is routed to a corresponding bonding finger, and wherein the plating trace portion of each via in the second plurality of vias is routed outward to the periphery of the substrate while the plating trace portion of each via in the first plurality of vias is routed inward toward a center of the substrate;

a semiconductor die positioned within the die receiving area;

means for electrically coupling the die to the plurality of bonding fingers on the substrate; and a protective body encapsulating the semiconductor.

17. The semiconductor device of claim 16 further comprising a recessed portion in [the surface of] the substrate within the plurality of bonding fingers, and wherein the plating trace portion of each via in the second plurality of vias terminates at the recessed portion.

18. The semiconductor device of claim 16 wherein the printed wiring substrate is selected from a group consisting of: a printed circuit board and a ceramic substrate.

19. A semiconductor device comprising:

a printed wiring substrate having a periphery, [a surface,] a die receiving area on the [surface] *substrate,* a first and a second plurality of conductive vias extending through the substrate, and a plating trace connected to each via of the first and the second pluralities of vias, wherein the plating traces associated with the first plurality of vias exist on the [surface] *substrate* and terminate at the periphery of the substrate and the plating traces associated with the second plurality of vias exist on the [surface] *substrate* and terminate near the die receiving area;

a semiconductor die positioned within the die receiving area;

means for electrically coupling the semiconductor die to the first and the second pluralities of vias; and means for providing environmental protection to the semiconductor die.

20. The semiconductor device of claim 19 wherein the printed wiring substrate is selected from a group consisting of: a printed circuit board and a ceramic substrate.

21. The semiconductor device of claim 19 further comprising a functional trace associated with each via of the first and the second pluralities of vias for carrying signals to the semiconductor die.

* * * * *

UNITED STATES PATENT AND TRADEMARK OFFICE

CERTIFICATE OF CORRECTION

PATENT NO. : Re. 36, 773
DATED : July 11, 2000
INVENTOR(S) : Victor K. Nomi, et al.

It is certified that error appears in the above-identified patent and that said Letters Patent is hereby corrected as shown below:

Claim 5, Column 7,
Line 29, Before to, insert -- to the nested plating bus without being connected --.

Signed and Sealed this

Seventeenth Day of July, 2001

*Attest:*

Nicholas P. Godici

NICHOLAS P. GODICI
*Acting Director of the United States Patent and Trademark Office*

*Attesting Officer*